(12) United States Patent
Cheng et al.

(10) Patent No.: US 10,877,505 B2
(45) Date of Patent: Dec. 29, 2020

(54) BANDGAP REFERENCE CIRCUIT, CONTROL CIRCUIT, AND ASSOCIATED CONTROL METHOD

(71) Applicant: TAIWAN SEMICONDUCTOR MANUFACTURING COMPANY LTD., Hsinchu (TW)

(72) Inventors: Nai Chen Cheng, Hsinchu (TW); Chung-Chieh Yang, Hsinchu County (TW); Chih-Chiang Chang, Taipei (TW); Yung-Chow Peng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/863,057

(22) Filed: Apr. 30, 2020

(65) Prior Publication Data

US 2020/0257326 A1    Aug. 13, 2020

Related U.S. Application Data

(63) Continuation of application No. 16/505,338, filed on Jul. 8, 2019, now Pat. No. 10,649,482, which is a
(Continued)

(51) Int. Cl.
*G05F 3/26* (2006.01)
*G05F 1/56* (2006.01)
(Continued)

(52) U.S. Cl.
CPC .............. *G05F 3/262* (2013.01); *G05F 1/468* (2013.01); *G05F 1/56* (2013.01); *H03K 5/24* (2013.01); *G05F 3/26* (2013.01)

(58) Field of Classification Search
CPC .................................. G05F 3/26; G05F 3/262
(Continued)

(56) References Cited

U.S. PATENT DOCUMENTS

2003/0201822 A1* 10/2003 Kang ......................... G05F 3/30
327/539
2004/0150381 A1* 8/2004 Butler ........................ G05F 3/30
323/313
(Continued)

*Primary Examiner* — Gary A Nash
(74) *Attorney, Agent, or Firm* — WPAT, P.C., Intellectual Property Attorneys; Anthony King

(57) ABSTRACT

A bandgap reference circuit includes a current generating circuit, a switch circuit and a control circuit. The current generating circuit is triggered by a trigger signal, generated when the bandgap reference circuit starts up, to mirror a base current to generate a first current and a second current. The current generating circuit is arranged to output the first current when triggered by the triggered signal. The switch circuit is controlled by a switch control signal to be selectively coupled between the current generating circuit and a terminal coupled to a regulator. The switch circuit is arranged to, when coupled between the current generating circuit and the terminal, allow the current generating circuit to output the second current to the terminal and accordingly provide a bandgap voltage. When the first current reduces to a predetermined level, the control circuit activates generation of the switch control signal to control the switch circuit.

20 Claims, 12 Drawing Sheets

Related U.S. Application Data continuation of application No. 16/168,304, filed on Oct. 23, 2018, now Pat. No. 10,345,847.

(51) Int. Cl.
*H03K 5/24* (2006.01)
*G05F 1/46* (2006.01)

(58) Field of Classification Search
USPC .......................................... 323/313, 315, 316
See application file for complete search history.

(56) References Cited

U.S. PATENT DOCUMENTS

| | | | |
|---|---|---|---|
| 2007/0182479 A1* | 8/2007 | Kim | G05F 3/205 |
| | | | 327/539 |
| 2007/0194770 A1* | 8/2007 | Kalyanaraman | G05F 3/30 |
| | | | 323/313 |
| 2011/0025291 A1* | 2/2011 | Lee | G05F 3/30 |
| | | | 323/313 |

* cited by examiner

BANDGAP REFERENCE CIRCUIT, CONTROL CIRCUIT, AND ASSOCIATED CONTROL METHOD

PRIORITY CLAIM AND CROSS-REFERENCE

The present application is a continuation application of U.S. patent application Ser. No. 16/505,338 filed on Jul. 8, 2019, which is a continuation application of U.S. patent application Ser. No. 16/168,304 filed on Oct. 23, 2018, all of which are incorporated herein by reference in their entireties.

BACKGROUND

A bandgap reference circuit is an indispensable circuit for a mixed signal integrated circuit (IC) for generating a constant voltage regardless of power supply variations, temperature changes and circuit loading from a device. Traditionally, the bandgap reference circuit has two stable points, one of which is a zero point and the other of which is a normal operation point. Therefore, in order to prevent the bandgap reference circuit from locking at the zero point, a start-up circuit is typically added. However, the start-up signal generated by the start-up circuit induces a large current spike which may damage the connected circuits and raises a reliability issue. Accordingly, a new bandgap reference circuit with control mechanism is desired to solve the aforementioned problems.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
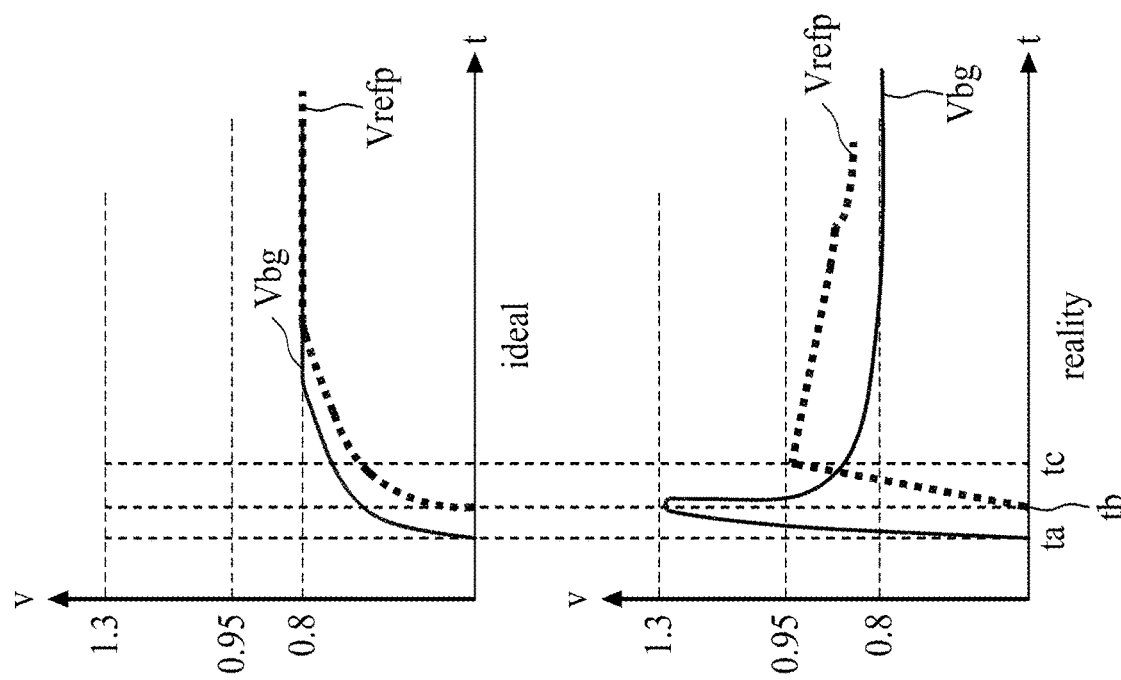
FIG. 1 is a diagram illustrating a bandgap voltage generated by a bandgap reference circuit according to an embodiment of the present disclosure.
Figure 1:
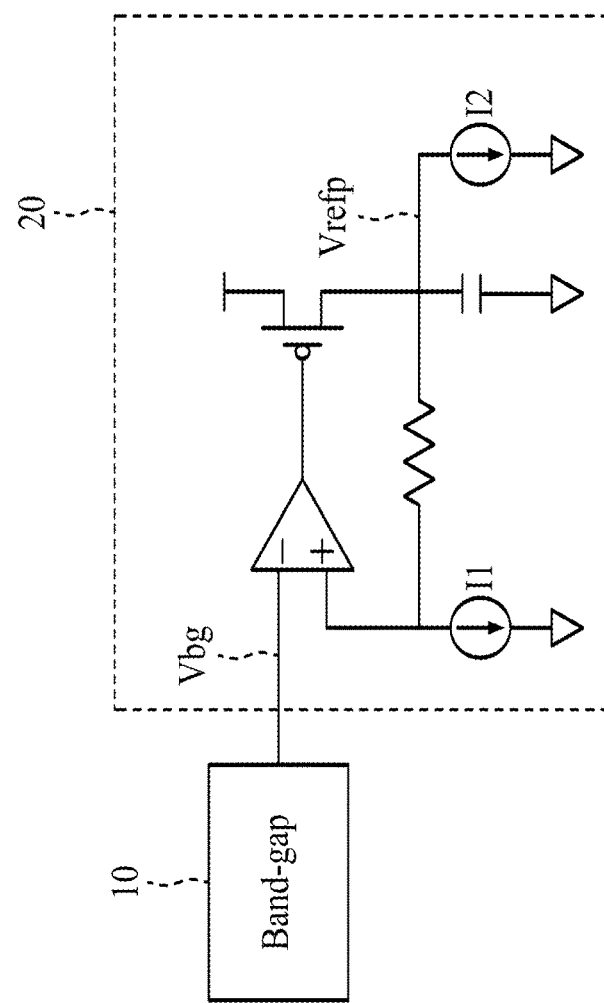

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features mayx be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a diagram illustrating a bandgap voltage Vbg generated by a bandgap reference circuit 10 according to an embodiment of the present disclosure. Referring to the left side of FIG. 1, the bandgap voltage Vbg generated by the bandgap reference circuit 10 is outputted to a Low Dropout Regulator (LDO) 20, and the LDO 20 generates a regulated reference voltage Vrefp according to the bandgap voltage Vbg. At some ideal process corners, when the bandgap reference circuit 10 starts up, the bandgap voltage Vbg changes smoothly without overshooting and settles at a predetermined voltage level (e.g., about 0.8 volts, see upper-right corner of FIG. 1). To put it more specifically, the bandgap reference circuit 10 and the LDO 20 start at a time point ta, a voltage profile of the bandgap voltage Vbg smoothly rises from a time point tb and settles to the predetermined voltage level (e.g., about 0.8 volts). The LDO 20 tracks the bandgap voltage Vbg to output the regulated reference voltage Vrefp, which settles to the predetermined voltage level (e.g., about 0.8 volts) slower than the bandgap voltage Vbg by a time lag.

At some non-ideal process corners, however, when the bandgap reference circuit 10 starts up, a start-up signal generated by a start-up circuit (not shown in FIG. 1) of the bandgap reference circuit 10 causes an undesired current spike which induces a corresponding undesired voltage spike on the bandgap voltage Vbg, as shown in the lower-right corner of FIG. 1. As a result, a voltage profile of the regulated reference voltage Vrefp generated by the LDO 20 may overshoot the predetermined voltage level (e.g., about 0.8 volts) and cause a reliability issue with the downstream attached circuits. More specifically, the bandgap reference circuit 10 starts at the time point ta, the start-up circuit of the bandgap reference circuit 10 generates the start-up signal with a steep rising edge which may induce a large start-up current. The large start-up current then causes the voltage spike at the bandgap voltage Vbg to about 1.3 volts, and then the bandgap voltage Vbg slowly settles from a time point tc. Since the LDO 20 tracks the bandgap voltage Vbg to output the regulated reference voltage Vrefp, the regulated reference voltage Vrefp may exceed the predetermined voltage level (e.g., about 0.8 volts) and reach a peak voltage of about 0.95 volts at the time point tc, and then settles to the predetermined voltage level (e.g., about 0.8 volts) slowly. Because the regulated reference voltage Vrefp is slower than the bandgap voltage Vbg by a time lag, the extension of overshoot of the regulated reference voltage Vrefp may be less severe than that of the bandgap voltage Vbg. However, it still may cause negative influences.

Figure 2:
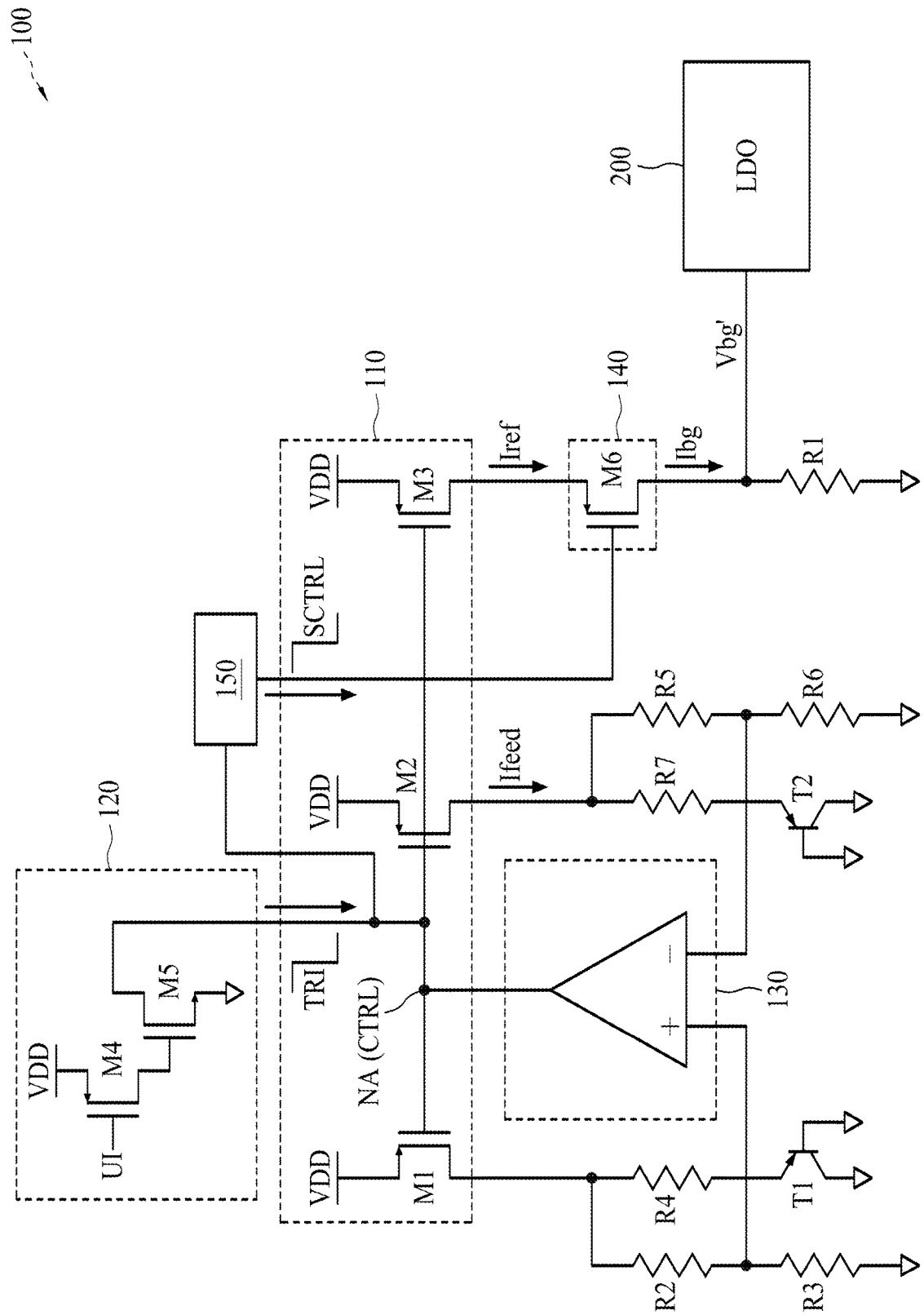
FIG. 2 is a diagram illustrating a bandgap reference circuit according to an embodiment of the present disclosure.

FIG. 2 is a diagram illustrating a bandgap reference circuit 100 according to an embodiment of the present disclosure. As shown in FIG. 2, the bandgap reference circuit 100 includes a current generating circuit 110, a start-up circuit 120, an error amplifier 130, a switch circuit 140 and a control circuit 150. The current generating circuit 110 is arranged to generate a reference current Iref and a feedback current Ifeed according to a control signal CTRL on a control node NA. The start-up circuit 120 is arranged to generate a trigger signal TRI, and output the trigger signal TRI to the control node NA as the control signal CTRL when the bandgap reference circuit 100 starts up. The error amplifier 130 is arranged to track the control signal CTRL based on the feedback current Ifeed. The switch circuit 140 is arranged to generate a bandgap current Ibg according to the reference current Iref, and to generate a bandgap voltage Vbg' by outputting the bandgap current Ibg to a resistor R1, wherein the bandgap voltage Vbg' is coupled to an LDO 200 for regulation. As shown in FIG. 2, when the bandgap reference circuit 100 starts up, the voltage profile of the trigger signal TRI is reduced from a logic high value to a logic low value, and the feedback current Ifeed and reference current Iref generated by PMOSFETs M1 to M3 greatly increase, thereby inducing the overshoot issue mentioned above.

The control circuit 150 is arranged to achieve a soft start-up for the bandgap reference circuit 100 by generating a switch control signal SCTRL according to the trigger signal TRI from the start-up circuit 120, wherein the switch control signal SCTRL controls a switch status of the switch circuit 140 to mitigate the overshoot issue mentioned above. For example, the switch control signal SCTRL avoids activating the switch circuit 140 as much as possible when the overshoot occurs. However, on the other hand, fast settling time of the bandgap voltage Vbg' becomes another concern for the bandgap reference circuit 100. The details of the operation of the bandgap reference circuit 100, which operates without incurring any of the aforementioned problems, will be discussed later. As shown in FIG. 2, the voltage profile of the switch control signal SCTRL is reduced from a logic high value to a logic low value; however, with a later trigger time point, an earlier settling time point, or a smaller amplitude than that of the trigger signal TRI. The details will be described in the following embodiments.

In one embodiment, the current generating circuit 110 includes transistors M1, M2 and M3, wherein the transistors M1 and M2 constitute a current mirror to generate the feedback current Ifeed while the transistors M1 and M3 constitute another current mirror to generate the reference current Iref. In this embodiment, the transistors M1 to M3 are implemented by P-type Metal-Oxide-Semiconductor Field-Effect Transistors (P-MOSFETs). However, this is not a limitation of the present disclosure. The start-up circuit 120 includes transistors M4 and M5, wherein the transistors M4 and M5 are implemented by a P-MOSFET and an N-MOSFET, respectively. A gate terminal of the transistor M4 receives a user input UI to trigger the start-up circuit 120. A drain terminal of the transistor M4 is coupled to a gate terminal of the transistor M5 while a source terminal of the transistor M4 is coupled to a supply voltage VDD. A source terminal of the transistor M5 is coupled to a reference voltage (e.g., a ground voltage), and a drain terminal of the transistor M5 outputs the trigger signal TRI to the control node NA. The bandgap reference circuit 100 further includes resistors R2 to R7 and transistors T1 and T2 for cooperating with the error amplifier 130, and the error amplifier 130 tracks the voltage on the control node NA with the function of the feedback circuit included in the resistors R2 to R7 and the transistors T1 and T2. Those skilled in the art should readily understand the functions of the current generating circuit 110, the start-up circuit 120 and the error amplifier 130, and the detailed description is omitted herein for brevity.

In an embodiment, the switch circuit 140 includes a transistor M6 implemented by a P-MOSFET. A gate terminal of the transistor M6 receives the switch control signal SCTRL to control the switch status of the switch circuit 140, a source terminal of the transistor M6 is coupled to a drain terminal of the transistor M3 to receive the reference current Iref, and the bandgap voltage Vbg' is generated at a drain terminal of the transistor M6. By being controlled by the switch control signal SCTRL, the magnitude of the bandgap current Ibg can be kept within an acceptable range, and the overshoot issue of the bandgap voltage can be effectively mitigated.

Figure 3:
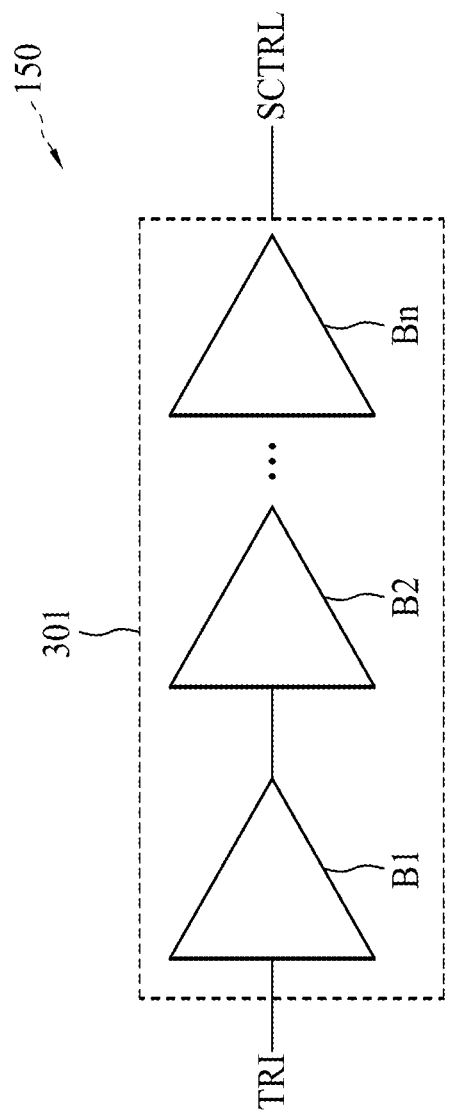
FIG. 3 is a diagram illustrating a control circuit according to an embodiment of the present disclosure.

FIG. 3 is a diagram illustrating the control circuit 150 according to an embodiment of the present disclosure. As shown in FIG. 3, the control circuit 150 includes a trigger time control circuit 301. The trigger time control circuit 301 is arranged to delay the trigger signal TRI received from the start-up circuit 120 as the switch control signal SCTRL. More specifically, the trigger time control circuit 301 includes a plurality of buffers B1 to Bn, wherein n is a positive number greater than 1. It should be noted that the number of the buffers included in the trigger time control circuit 301 shown in FIG. 3 is only for illustrative purpose. In other embodiments, the trigger time control circuit 301 may include only one buffer. The actual number of buffers included in the trigger time control circuit 301 is based on the designer's consideration. By delaying the trigger signal TRI, a trigger time point of the switch control signal SCTRL is later than that of the trigger signal TRI.

Figure 4:
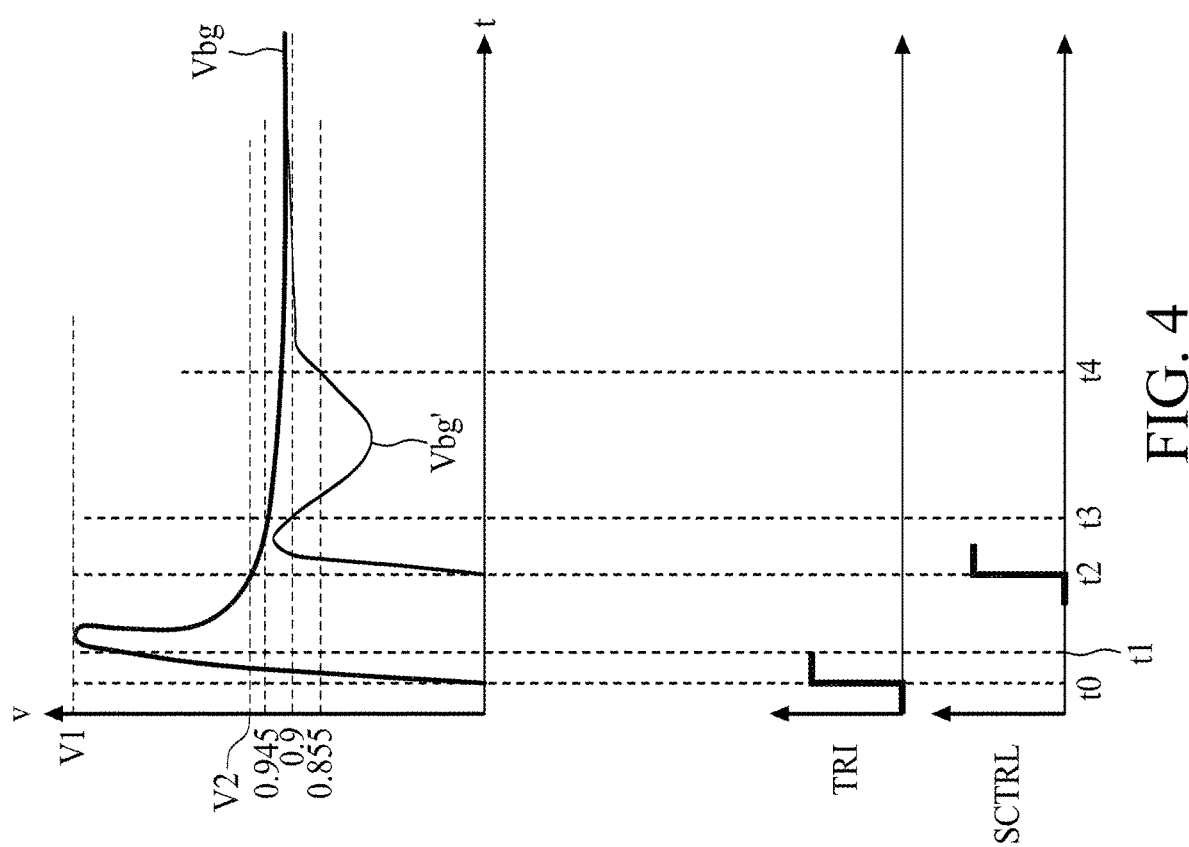
FIG. 4 is a diagram illustrating a bandgap voltage generated by the control circuit shown in FIG. 3 according to an embodiment of the present disclosure.

Refer to FIGS. 2 and 3 in conjunction with FIG. 4, which is a diagram illustrating the bandgap voltage Vbg' generated by the control circuit 150 shown in FIG. 3 according to an embodiment of the present disclosure. By delaying the trigger signal TRI, the trigger time point of the switch control signal SCTRL is later than that of the trigger signal TRI. Therefore, the switch circuit 140 is activated at a later time point. More specifically, the bandgap reference circuit 100 starts up at the time point t0, and the trigger signal TRI is accordingly generated. In contrast to the voltage profile of the trigger signal TRI shown in FIG. 2, the trigger signal TRI in FIG. 4 increases from a logic low value to a logic high value at the time point t0 indicating a representation of starting up the bandgap reference circuit 100 for better comprehension. Similarly, in contrast to the voltage profile of the switch control signal SCTRL, the switch control signal SCTRL in FIG. 4 increases from a logic low value to a logic high value at the time point t2 indicating the activation of the switch circuit 140 for better comprehension. Those skilled in the art should understand that the changing states of the trigger signal TRI and the switch control signal SCTRL can be readily altered by an implementation of an inverter (not shown in FIGS. 2 and 3). In the prior art, without the architecture proposed by the present disclosure, the bandgap voltage Vbg has a spike with a peak (e.g., the voltage level V1) at the time point t1. However, with the control circuit 150 shown in FIG. 3, the switch control signal SCTRL activates the switch circuit 140 at the time point t2 which is later than the time point t1 by a time lag. Because the voltage of the bandgap voltage Vbg has been reduced from the peak of the spike at the time point t2, the resultant large spike of the bandgap current Ibg is also reduced. Therefore, the bandgap voltage Vbg' does not suffer from the severe overshoot issue. The bandgap voltage Vbg' is settled when a predetermined voltage, for example, about 0.855 volts, is reached at a time point t4.

Similarly, the bandgap voltage Vbg is settled at the time point t3 when about 0.945 volts is reached. It should be noted that the waveforms of the trigger signal TRI, the switch control signal SCTRL and the bandgap voltage Vbg' shown in FIG. 4 are only for illustrative purpose. The time lag between the time points t0 and t2 is determined by the number of the buffers included in the trigger time control circuit 301, and in this embodiment, the time point t2 is determined when the bandgap voltage Vbg attenuates from the peak value (e.g., the voltage level V1 shown in FIG. 4) to a predetermined voltage level V2. In this embodiment, the difference between the predetermined voltage level V2 and the settled voltage for the bandgap voltage Vbg' (e.g., about 0.9 volts) is 40% of the difference between the voltage level V1 and the settled voltage for the bandgap voltage Vbg'. However, this is only for illustrative purpose, and as long as the switch circuit 140 is activated at a time point later than the time point t1 (i.e., the time point t2 is later than the time point t1), such alternative designs shall fall within the scope of the present disclosure.

Figure 5:
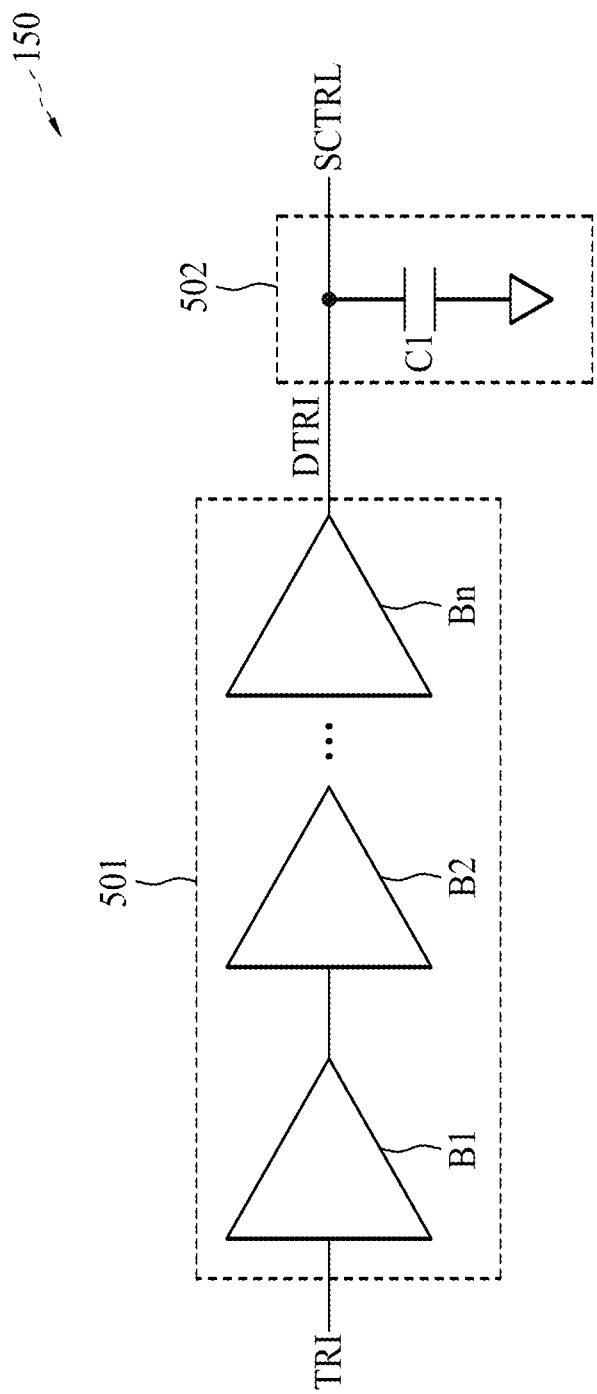
FIG. 5 is a diagram illustrating a control circuit according to another embodiment of the present disclosure.

FIG. 5 is a diagram illustrating the control circuit 150 according to another embodiment of the present disclosure. As shown in FIG. 5, the control circuit 150 includes a trigger time control circuit 501 arranged to generate a delayed trigger signal DTRI according to the trigger signal TRI. The trigger time control circuit 501 includes buffers B1 to Bn where n is a positive number greater than 1. The trigger time control circuit 501 controls a trigger time point of the switch control signal SCTRL by the buffers included in the trigger time control circuit 501 to avoid activating the switch circuit 140 when the overshoot of the bandgap voltage Vbg occurs. In this embodiment, the number of buffers included in the trigger time control circuit 501 is less than the number of buffers included in the trigger time control circuit 301, that is, the trigger time point of the delayed trigger signal DTRL of FIG. 5 is earlier than that of the switch control signal SCTRL of FIG. 3. However, the earlier trigger time point for the delayed trigger signal DTRI induces a larger undesired voltage spike for the bandgap voltage Vbg'. Therefore, the control circuit 150 further includes a settling time control circuit 502 including a capacitor C1. The capacitor C1 extends the settling time of the delayed trigger signal DTRI to generate the switch control signal SCTRL, and the extension of the settling time of the switch control signal SCTRL slows the activation of the switch circuit 140 to prevent a larger voltage spike of the bandgap voltage Vbg. Overall, the bandgap voltage Vbg' is settled earlier due to the earlier trigger time point of the switch control signal SCTRL. In this embodiment, the capacitance of the capacitor C1 is in a range from 1 picofarad (pF) to 10 pF, which should not be a limitation of the present disclosure. With such configuration, the switch circuit 140 is controlled by the switch control signal SCTRL generated by the combination of the trigger time control circuit 501 and the settling time control circuit 502, thereby mitigating the overshoot issue and settling the bandgap voltage Vbg' earlier.

Figure 6:
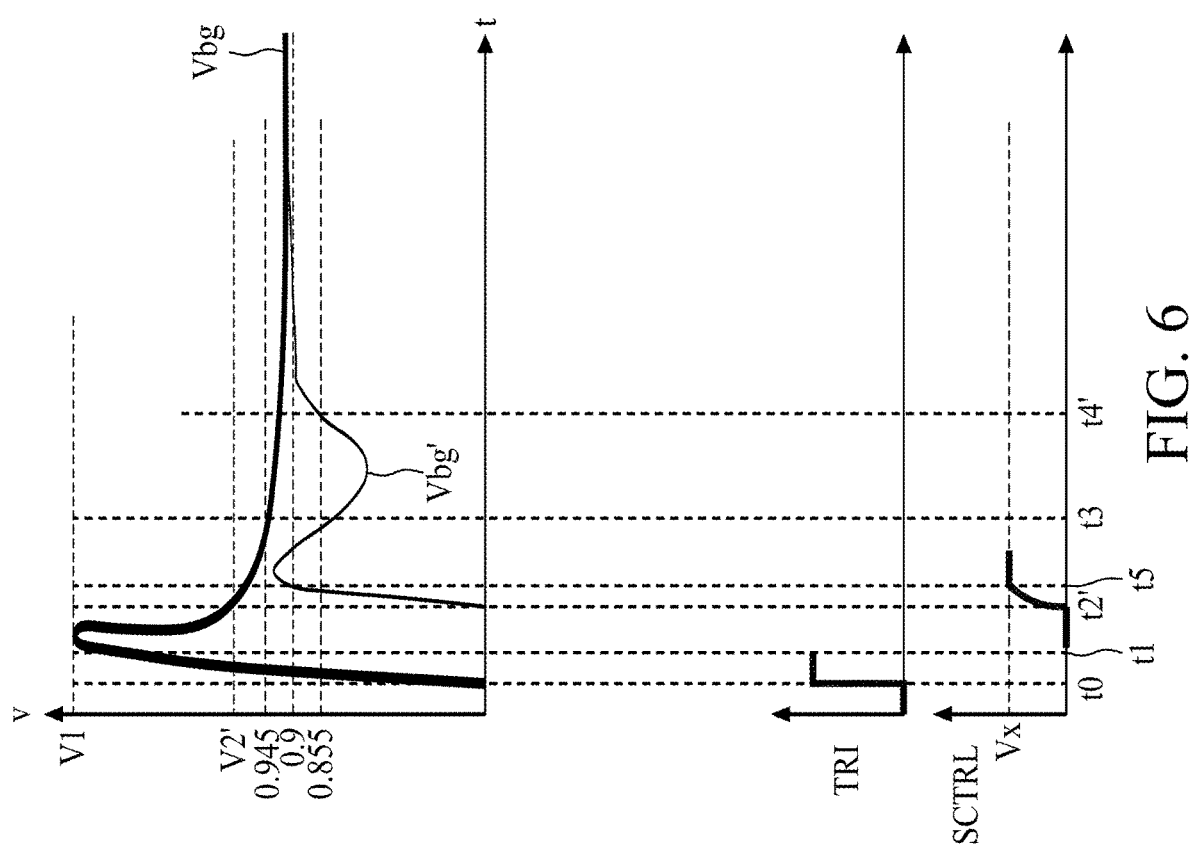
FIG. 6 is a diagram illustrating a bandgap voltage generated by the control circuit shown in FIG. 5 according to an embodiment of the present disclosure.

FIG. 6 is a diagram illustrating the bandgap voltage Vbg' generated by the control circuit 150 shown in FIG. 5 according to an embodiment of the present disclosure. As shown in FIG. 6, due to the function of the trigger time control circuit 501, the trigger time point of the switch control signal SCTRL is later than that of the trigger signal TRI but earlier than that of the switch control signal SCTRL of FIG. 4, and due to the function of the settling time control circuit 502, the settling time of the switch control signal SCTRL is longer than that of the trigger signal TRI. In addition, the settling time of the switch control signal SCTRL shown in FIG. 6 is a curved line instead of a straight line due to the presence of the capacitor C1, and the settling time of the switch control signal SCTRL is thereby longer than that in FIG. 4. It can be observed that without the control circuit 150 proposed by the embodiments of the present disclosure, the original bandgap voltage Vbg triggered by the trigger signal TRI would suffer from an overshoot issue. However, with the switch circuit 140 of FIG. 2 and the control circuit 150 of FIG. 5, the overshoot issue is effectively mitigated for the improved bandgap voltage Vbg', and the bandgap voltage Vbg' shown in FIG. 6 is settled earlier than that shown in FIG. 4 due to the earlier trigger time point of the switch control signal SCTRL. In addition, it can be observed that the voltage profile of the switch control signal SCTRL forms a first order resistor-capacitor charging waveform, which is an exponential function due to the presence of the capacitor C1.

More specifically, the bandgap reference circuit 100 starts at the time point t0, and the trigger signal TRI is accordingly generated. Previously, without the architecture proposed by the present disclosure, the bandgap voltage Vbg has a spike with a peak (e.g., the voltage level V1) at the time point t1. However, with the control circuit 150 shown in FIG. 5, the switch control signal SCTRL is triggered at the time point t2', which is a time point later than t1 but earlier than the time point t2 shown in FIG. 4, and the switch control signal SCTRL is settled at a time point t5 at a voltage level Vx. When the switch circuit 140 is totally activated at the time point t5 by the switch control signal SCTRL, the large spike of the bandgap current Ibg outputted by the switch circuit 140 is reduced. Therefore, the bandgap voltage Vbg' does not suffer from the severe overshoot issue. Although the trigger time point t2' is earlier than the time point t2 shown in FIG. 4, the overshoot issue of the bandgap voltage Vbg' is still mitigated due to the presence of the capacitor C1. In addition, because the trigger time point of the switch control signal SCTRL is earlier, the bandgap voltage Vbg' is settled earlier than that of FIG. 4, even though the capacitor C1 may cause a slight delay to the overall settling time. Therefore, it can be observed that the bandgap voltage Vbg' is settled at a predetermined voltage, for example, about 0.855 volts at a time point t4', which is earlier than the time point t4 of FIG. 4. The bandgap voltage Vbg is settled at the time point t3 when a voltage of about 0.945 volts is reached. In addition, the time point t2' is determined when the bandgap voltage Vbg drops from the peak voltage level (e.g., the voltage level V1 shown in FIG. 6) to a predetermined voltage level V2'. In this embodiment, the difference between the predetermined voltage level V2' and the settled voltage for the bandgap voltage Vbg' (e.g., about 0.9 volts) is 50% of the difference between the voltage level V1 and the settled voltage for the bandgap voltage Vbg'. However, this is only for illustrative purpose, and as long as the switch circuit 140 is activated at a time point later than the time point t1, then alternative designs shall fall within the scope of the present disclosure.

Figure 7:
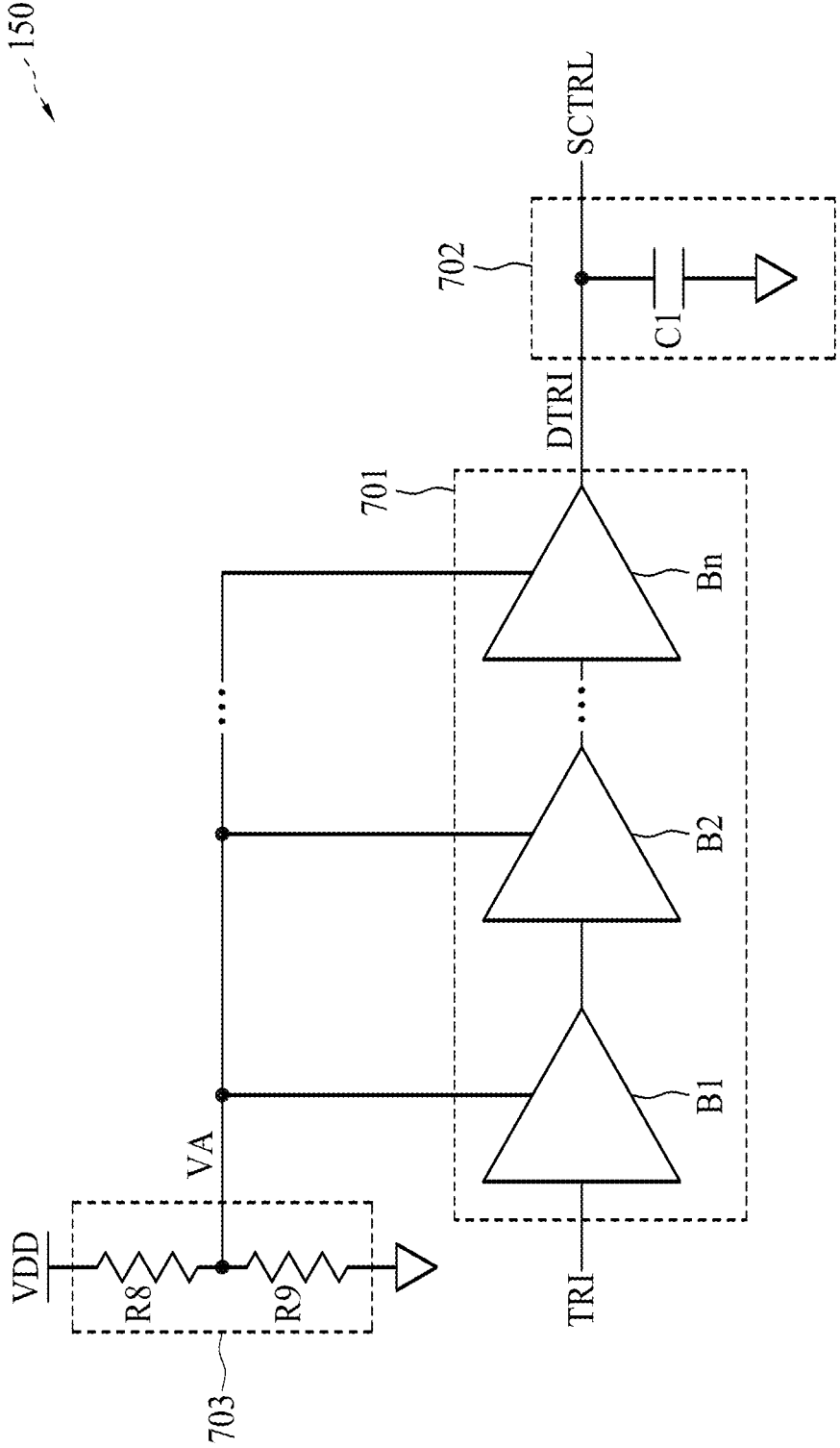
FIG. 7 is a diagram illustrating a control circuit according to another embodiment of the present disclosure.

FIG. 7 is a diagram illustrating the control circuit 150 according to yet another embodiment of the present disclosure. The control circuit 150 includes a trigger time control circuit 701, a settling time control circuit 702 and a voltage dividing circuit 703. The trigger time control circuit 701 is similar to the trigger time control circuit 501, and the settling time control circuit 702 is similar to the settling time control circuit 502. The only difference is that the buffers B1 to Bn of the trigger time control circuit 701 are driven by a smaller driving voltage. More specifically, the voltage dividing circuit 703 is arranged to execute a voltage dividing operation on the supply voltage VDD with resistors R8 and R9 to generate a divided voltage VA. The resistance of the resistors R8 and R9 is not limited by the present disclosure. In other words, the magnitude of the divided voltage VA is not limited by the present disclosure. By being driven by the divided voltage VA, the amplitudes of the delayed trigger signal DTRI and the switch control signal SCTRL are smaller than the amplitudes of the embodiment shown in FIG. 5. Accordingly, the transient bandgap current Ibg outputted by the switch circuit 140 is smaller due to the small gate voltage at the gate terminal of the PMOSFET M6, and the overshoot issue of the bandgap voltage Vbg' is effectively mitigated. Therefore, due in part to the smaller amplitude of the switch control signal SCTRL, the switch control signal SCTRL can be triggered at an earlier trigger time point than the trigger time point in the embodiment of FIG. 5 by reducing the number of buffers included in the trigger time control circuit 710, and the bandgap voltage Vbg' can also be settled earlier than in the embodiment of FIG. 5.

Figure 8:
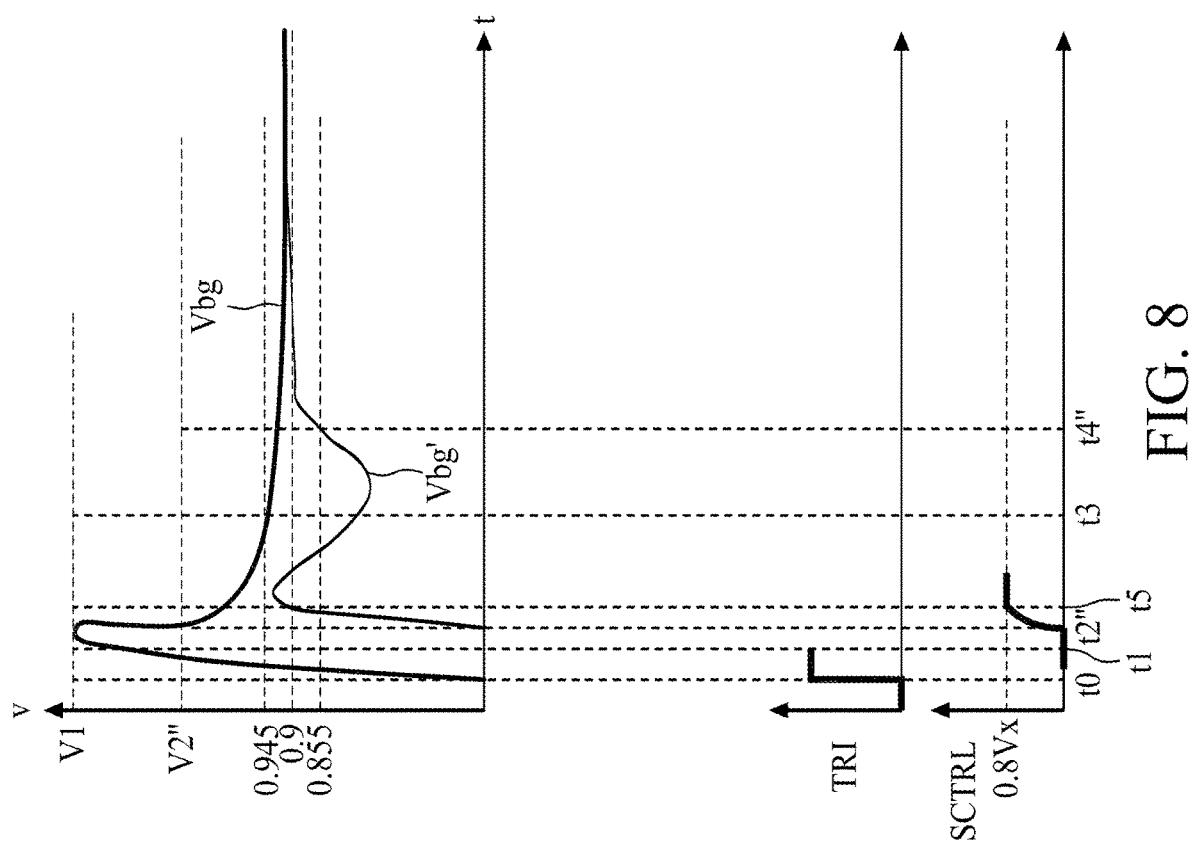
FIG. 8 is a diagram illustrating a bandgap voltage generated by the control circuit shown in FIG. 7 according to an embodiment of the present disclosure.

Refer to FIG. 8 in conjunction with FIG. 7, which is a diagram illustrating the bandgap voltage Vbg' generated by the control circuit 150 shown in FIG. 7 according to an embodiment of the present disclosure. As shown in FIG. 8, due to the function of the trigger time control circuit 701, the trigger time point of the switch control signal SCTRL is later than that of the trigger signal TRI but earlier than that of the switch control signal SCTRL of FIG. 6, and due to the function of the settling time control circuit 702, the settling time of the switch control signal SCTRL is longer than that of the trigger signal TRI. In addition, by being driven by the divided voltage Va, the amplitude of the switch control signal SCTRL is only 0.8Vx, which is smaller than that shown in FIG. 6. Therefore, the switch circuit 140 controlled by the switch control signal SCTRL with smaller amplitude outputs the bandgap current Ibg with a relatively weak magnitude during transient, and the overshoot issue of the bandgap voltage Vbg' is accordingly mitigated. However, the amplitude of the switch control signal SCTRL is only for illustrative purpose, and does not comprise a limitation of the present disclosure. It can be observed that without the control circuit 150 proposed by the embodiments of the present disclosure, the original bandgap voltage Vbg triggered by the trigger signal TRI would suffer from an overshoot issue. However, with the switch circuit 140 shown in FIG. 2 and the control circuit 150 shown in FIG. 7, the overshoot issue is effectively mitigated for the improved bandgap voltage Vbg', and the Vbg' shown in FIG. 8 is settled earlier than in the embodiment shown in FIG. 6. In addition, it can be observed that the voltage profile of the switch control signal SCTRL forms a first order resistor-capacitor charging waveform which is an exponential function due to the presence of the capacitor C1.

More specifically, the bandgap reference circuit 100 starts at the time point t0, and the trigger signal TRI is accordingly generated. Previously, without the architecture proposed by the present disclosure, the bandgap voltage Vbg would exhibit a spike with a peak (e.g., the voltage level V1) at the time point t1. However, with the control circuit 150 shown in FIG. 7, the switch control signal SCTRL is triggered at the time point t2" which is a time point later than t1 but earlier than the time point t2' of FIG. 6, and the switch control signal SCTRL is settled at a time point t5' at a voltage level 0.8Vx. When the switch circuit 140 is totally activated at the time point t5' by the switch control signal SCTRL, the large spike of the bandgap current Ibg outputted by the switch circuit 140 is reduced. Therefore, the bandgap voltage Vbg' does not suffer from the severe overshoot issue. Although the trigger time point t2" is earlier than the time point t2' shown in FIG. 6, and the switch circuit 140 is thus activated earlier by the switch control signal SCTRL, the overshoot issue of the bandgap voltage Vbg' is still mitigated due to the smaller amplitude of the switch control signal SCTRL. In addition, because the trigger time point of the switch control signal SCTRL is earlier, the bandgap voltage Vbg' is settled earlier than in the embodiment of FIG. 6. Therefore, it can be observed that the bandgap voltage Vbg' is settled at a predetermined voltage, for example, about 0.855 volts at a time point t4", which is earlier than the time point t4' of FIG. 6. The bandgap voltage Vbg is settled at the time point t3 when a voltage level of about 0.945 volts is reached. In addition, the time point t2" is determined when the bandgap voltage Vbg drops from the peak value (e.g., the voltage level V1 shown in FIG. 8) to a predetermined voltage level V2". In this embodiment, the difference between the predetermined voltage V2" and the settled voltage for the bandgap voltage Vbg' (e.g., about 0.9 volts) is 60% of the difference between the voltage V1 and the settled voltage for the bandgap voltage Vbg'. However, this is only for illustrative purpose, and as long as the switch circuit 140 is activated at a time point later than the time point t1, alternative designs shall fall within the scope of the present disclosure.

Figure 9:
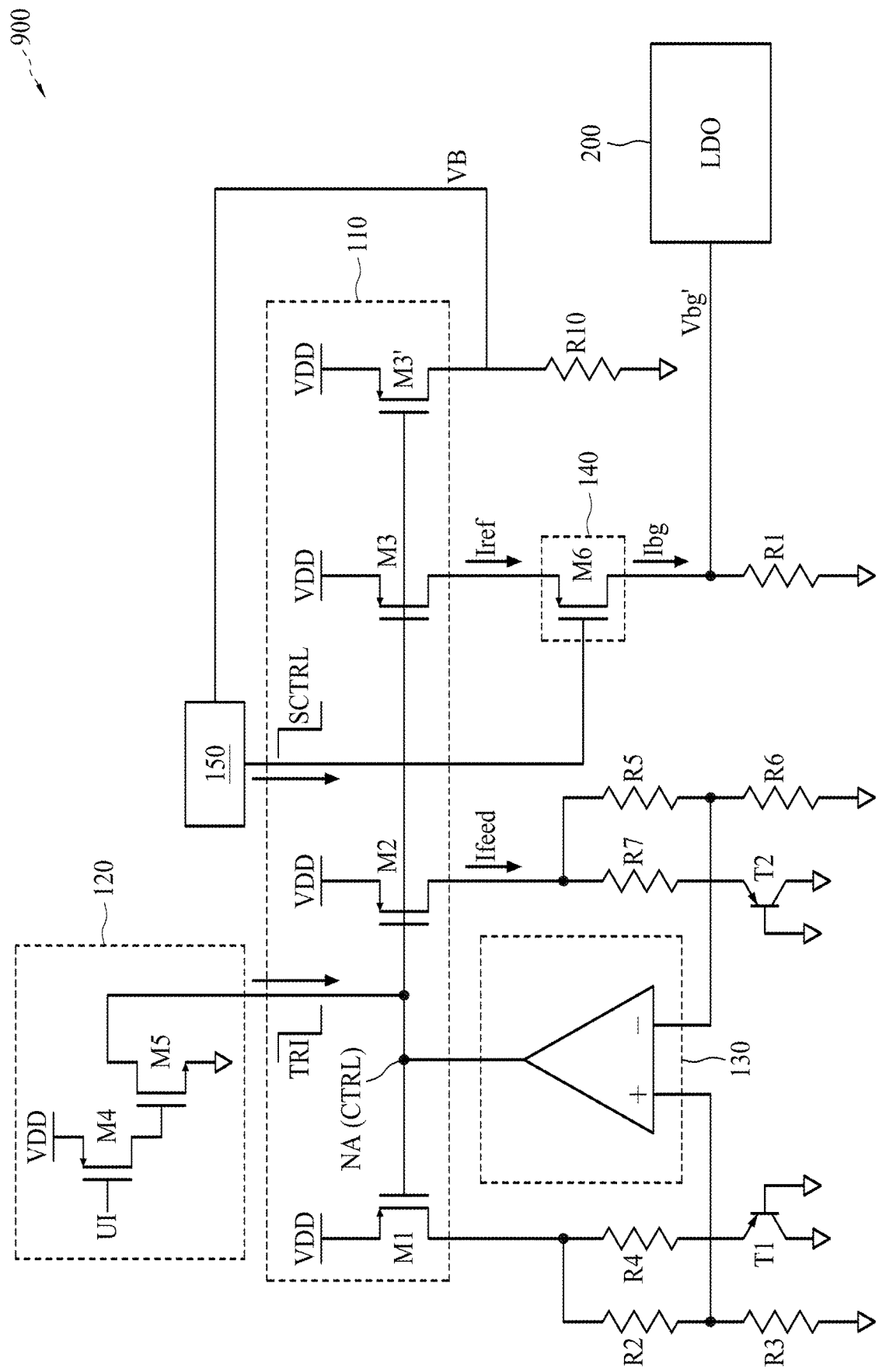
FIG. 9 is a diagram illustrating a bandgap reference circuit according to another embodiment of the present disclosure.

FIG. 9 is a diagram illustrating a bandgap reference circuit 900 according to another embodiment of the present disclosure. The bandgap reference circuit 900 is similar to the bandgap reference circuit 100, and descriptions of similar details are omitted herein for brevity. The current generating circuit 110 shown in FIG. 9 further includes a transistor M3' and a resistor R10 for generating a reference voltage VB, and the control circuit 150 receives the reference voltage VB to generate the switch control signal SCTRL. The reference voltage VB is outputted from the transistor M3' by receiving the trigger signal TRI. Therefore, the reference voltage VB is identical to the original bandgap voltage Vbg shown in FIG. 1, which suffers from the overshoot issue; that is, the reference voltage VB is triggered by the trigger signal TRI when the bandgap reference circuit 900 starts up.

Figure 10:
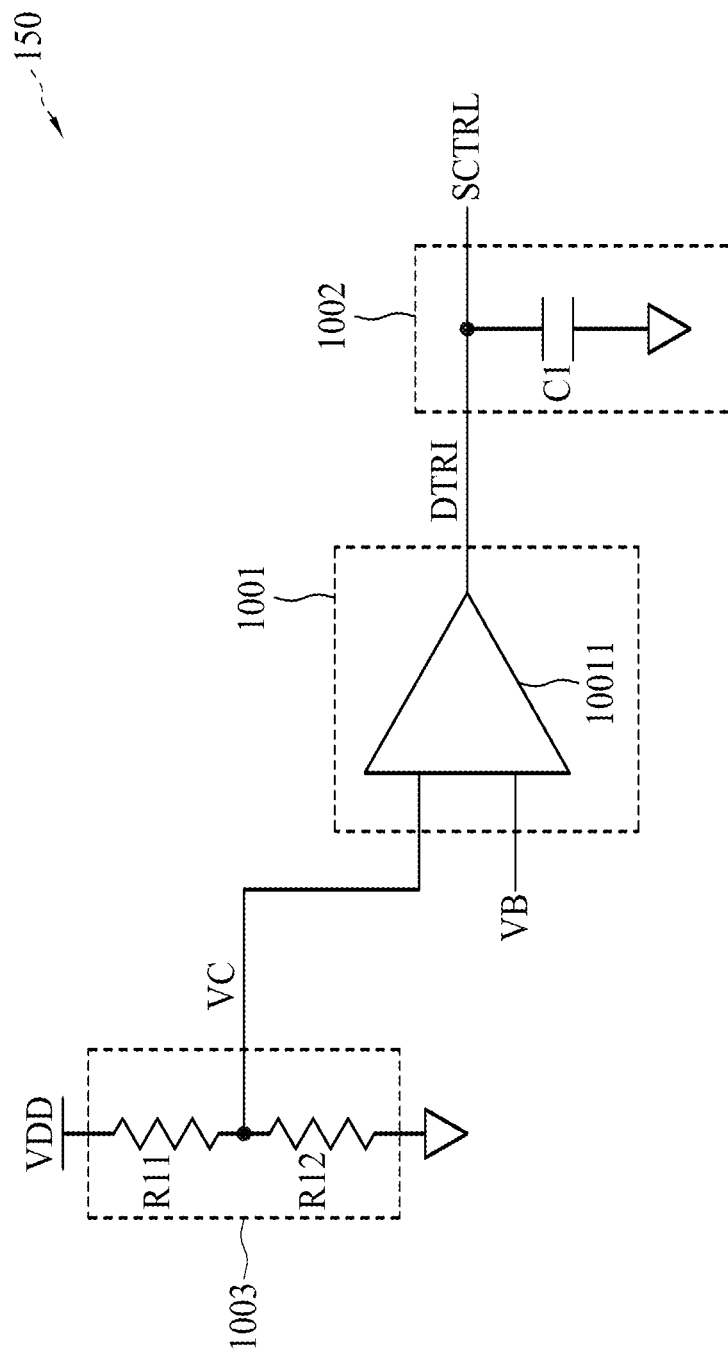
FIG. 10 is a diagram illustrating a control circuit according to yet another embodiment of the present disclosure.

FIG. 10 is a diagram illustrating the control circuit 150 according to yet another embodiment of the present disclosure. The control circuit 150 includes a trigger time control circuit 1001, a settling time control circuit 1002 and a voltage dividing circuit 1003, wherein the settling time control circuit 1002 including the capacitor C1 is similar to the settling time control circuits 502 and 702. The voltage dividing circuit 1003 including resistors R11 and R12 is arranged to execute the voltage dividing operation upon the supply voltage VDD to generate a divided voltage VC, wherein the resistance of the resistors R11 and R12 is not limited by the present disclosure. In other words, the magnitude of the divided voltage VC is not limited by the present disclosure. In this embodiment, the divided voltage VC is slightly lower than the settled voltage of the reference voltage VB. The trigger time control circuit 1001 includes a comparator 10011 to compare the reference voltage VB and the divided voltage VC. With such configuration, when the reference voltage VB does not suffer from the overshoot issue, that is, when the reference voltage VB smoothly rises and settles at the settled voltage (e.g., about 0.9 volts), the comparator 10011 can still generate the delayed trigger signal DTRI by comparing the divided voltage VC and the reference voltage VB in order to ensure the functionality of the bandgap circuit 900 by making sure that the divided voltage VC is slightly smaller than the settled voltage of the reference voltage VB.

More specifically, when the reference voltage VB is greater than the divided voltage VC due to the occurrence of the overshoot issue, the comparator 10011 generates the delayed trigger signal DTRI, which has a waveform similar to that of the trigger signal TRI. The trigger time point of the delayed trigger signal DTRI is later than that of the trigger signal TRI due to the function of the comparator 10011. In addition, due in part to the function of the settling time control circuit 1002, the settling time of the delayed trigger signal DTRI is adjusted (e.g., extended) to generate the switch control signal SCTRL.

Figure 11:
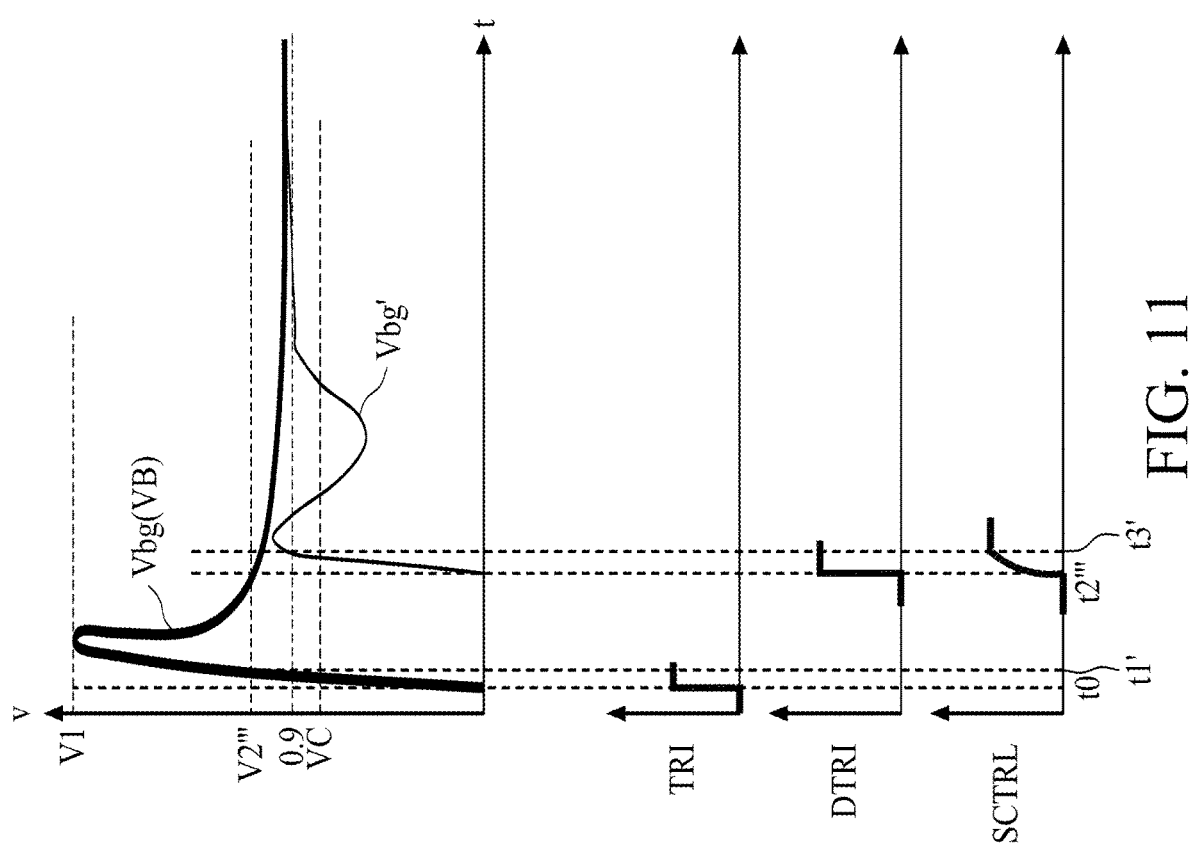
FIG. 11 is a diagram illustrating a bandgap voltage generated by the control circuit shown in FIG. 10 according to an embodiment of the present disclosure.

FIG. 11 is a diagram illustrating the bandgap voltage Vbg' generated by the control circuit 150 shown in FIG. 10 according to an embodiment of the present disclosure. As shown in FIG. 11, when the bandgap voltage Vbg (i.e., the reference voltage VB) is greater than the divided voltage VC, the delayed trigger signal DTRI generated by comparing the bandgap voltage Vbg and the divided voltage VC indicates that the bandgap voltage Vbg suffers from the overshoot issue, and the delayed trigger signal DTRI shows a logic high value (i.e., the logic value '1'). The switch control signal SCTRL is triggered with the delayed trigger signal DTRI, and is triggered with a longer settling time. Therefore, the switch circuit 140 is activated and the bandgap voltage Vbg' is generated. More specifically, the bandgap reference circuit 900 starts at the time point t0, and the reference voltage VB is accordingly generated. The bandgap voltage Vbg (i.e. the reference voltage VB) has a voltage value greater than the divided voltage VC at the time point t1', which indicates that the reference voltage VB may suffer from the overshoot issue. Next, the delayed trigger signal DTRI is triggered at the time point t2''', which is later than the time point t1, and later than the spike of the reference voltage VB due to the operation of the comparator 10011. The switch control signal SCTRL is triggered at the time point t2''' as well, and settles at the voltage level Vx at a time point t3'. Therefore, the switch control signal SCTRL activates the switch circuit 140 at the time point t3' which is later than the spike of the reference voltage VB, and the large spike of the bandgap current Ibg outputted by the switch circuit 140 is reduced. Therefore, the bandgap voltage Vbg' does not suffer from the severe overshoot issue. In addition, the time point t2''' is determined when the bandgap voltage Vbg drops from the peak value (e.g., the voltage level V1 shown in FIG. 11) to a predetermined voltage level V2'''. In this embodiment, the difference between the predetermined voltage level V2''' and the settled voltage for the bandgap voltage Vbg' (e.g., about 0.9 volts) is 40% of the difference between the voltage level V1 and the settled voltage for the bandgap voltage Vbg'.

Figure 12:
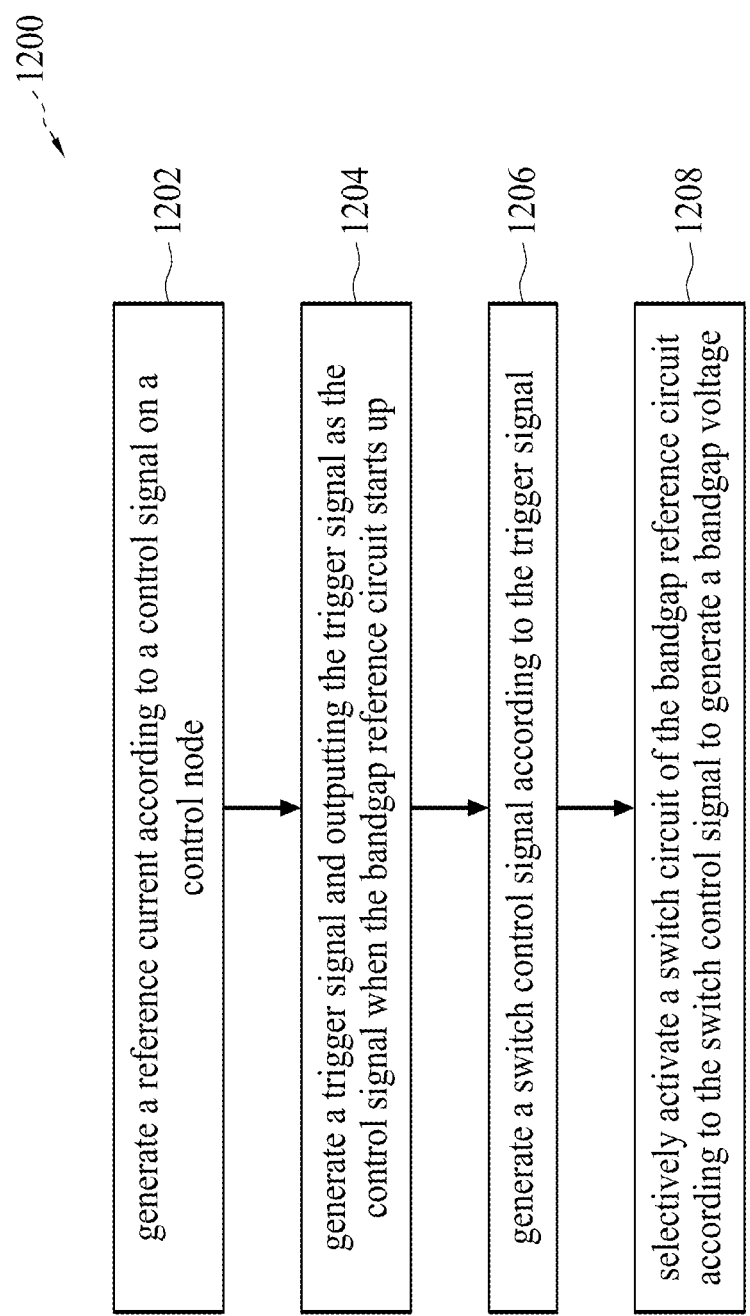
FIG. 12 is a flowchart illustrating a method of a bandgap reference circuit according to an embodiment of the present disclosure.

FIG. 12 is a flowchart illustrating a method 1200 of the bandgap reference circuit 100 or 900 according to an embodiment of the present disclosure. Provided that the results produced are substantially the same, the steps shown in FIG. 12 are not required to be executed in the exact order described, and other orders may be followed. The method 1200 is summarized as follows.

In step 1202: the reference current Iref is generated according to the control signal CTRL on the control node NA.

In step 1204: the trigger signal TRI is generated and outputted as the control signal CTRL when the bandgap reference circuit 100 or 900 starts up.

In step 1206: the switch control signal SCTRL is generated according to the trigger signal TRI.

In step 1208: the switch circuit 140 is selectively activated according to the switch control signal SCTRL to generate the bandgap voltage Vbg', wherein the bandgap voltage Vbg' is outputted to the regulator 200 coupled to the bandgap reference circuit 100 or 900.

Those skilled in the art should readily understand the method 1200 after reading the paragraphs mentioned above. The detailed description is omitted herein for brevity.

In some embodiments, a bandgap reference circuit is disclosed. The bandgap reference circuit includes: a current generating circuit, a start-up circuit, a switch circuit, and a control circuit. The current generating circuit is arranged to generate a reference current according to a control signal on a control node. The start-up circuit is coupled to the current generating circuit and arranged to generate a trigger signal and output the trigger signal as the control signal when the bandgap reference circuit starts up. The switch circuit is coupled to the current generating circuit and arranged to generate a bandgap voltage according to the reference current, and the bandgap voltage is outputted to a regulator coupled to the bandgap reference circuit. The control circuit is coupled to the control node and the switch circuit and arranged to generate a switch control signal according to the trigger signal, wherein the switch control signal controls a switch status of the switch circuit.

In some embodiments, a method of a bandgap reference circuit is disclosed. The method includes: generating a reference current according to a control signal on a control node; generating a trigger signal and outputting the trigger signal as the control signal when the bandgap reference circuit starts up; generating a switch control signal according to the trigger signal; and selectively activating a switch circuit of the bandgap reference circuit according to the switch control signal to generate a bandgap voltage at a terminal of the switch circuit, wherein the bandgap voltage is outputted to a regulator coupled to the bandgap reference circuit.

In some embodiments, a control circuit of a bandgap reference circuit is disclosed, wherein the bandgap reference circuit includes a start-up circuit arranged to generate a trigger signal when the bandgap reference circuit starts up. The control circuit includes: a trigger time control circuit and a settling time control circuit. The trigger time control circuit is arranged to generate a delayed trigger signal according to the trigger signal, wherein a trigger time point of the delayed trigger signal is later than the trigger time point of the trigger signal. The settling time control circuit is coupled to the delay time control circuit and arranged to extend a settling time of the delayed trigger signal as a switch control signal arranged to control a switch status of a switch circuit of the bandgap reference circuit.

What is claimed is:

1. A bandgap reference circuit, comprising:
  a current generating circuit, arranged to be triggered by a trigger signal to mirror a base current to generate a first current and a second current, the trigger signal being generated when the bandgap reference circuit starts up, the current generating circuit being arranged to output the first current when triggered by the triggered signal;
  a switch circuit, controlled by a switch control signal to be selectively coupled between the current generating circuit and a terminal coupled to a regulator, the switch circuit being arranged to, when coupled between the current generating circuit and the terminal, allow the current generating circuit to output the second current to the terminal and accordingly provide a bandgap voltage to the regulator; and
  a control circuit, coupled to the current generating circuit and the switch circuit, the control circuit being arranged to, when the first current outputted from the current generating circuit reduces to a predetermined level, activate generation of the switch control signal to control the switch circuit to be coupled between the current generating circuit and the terminal.

2. The bandgap reference circuit of claim 1, wherein a trigger time point of the switch control signal is later than a trigger time point of the trigger signal.

3. The bandgap reference circuit of claim 1, wherein the control circuit is arranged to generate the switch control signal by delaying the trigger signal.

4. The bandgap reference circuit of claim 3, wherein the control circuit comprises one or more buffers connected in series; the one or more buffers connected in series are arranged to delay the trigger signal to output the switch control signal.

5. The bandgap reference circuit of claim 4, wherein the control circuit further comprises a voltage dividing circuit; the voltage dividing circuit is arranged to execute a voltage dividing operation upon a supply voltage to generate a divided voltage to drive the one or more buffers.

6. The bandgap reference circuit of claim 1, wherein the control circuit comprises:
  a trigger time control circuit, arranged to generate a delayed trigger signal according to the trigger signal, wherein a trigger time point of the delayed trigger signal is later than the trigger time point of the trigger signal; and
  a settling time control circuit, coupled to the trigger time control circuit, wherein the settling time control circuit is arranged to adjust a settling time of the delayed trigger signal to generate the switch control signal.

7. The bandgap reference circuit of claim 6, wherein the trigger time control circuit comprises one or more buffers connected in series; the one or more buffers connected in series are arranged to delay the trigger signal to generate the delayed trigger signal.

8. The bandgap reference circuit of claim 6, wherein the trigger time control circuit comprises a comparator; the comparator is arranged to compare a predetermined voltage with a reference voltage to generate the delayed trigger signal; the reference voltage is generated in response to the base current.

9. The bandgap reference circuit of claim 8, wherein the current generating circuit is further configured to mirror the base current to generate a third current; when triggered by the triggered signal, the current generating circuit is configured to output the third current to a node coupled to the comparator, and accordingly provide the reference voltage to the comparator.

10. The bandgap reference circuit of claim 6, wherein the settling time control circuit comprises a capacitor; the capacitor is arranged to extend the settling time of the delayed trigger signal to generate the switch control signal.

11. A control method of a bandgap reference circuit, comprising:
  when the bandgap reference circuit starts up, mirroring a base current to generate a first current and a second current;
  outputting the first current, mirrored from the base current, according to a trigger signal indicating that the bandgap reference circuit starts up;
  when the first current reduces to a predetermined level, activating generation of a switch control signal according to the trigger signal; and
  outputting a second current, mirrored from the base current, to a terminal coupled to a regulator according to the switch control signal, a bandgap voltage being generated at the terminal and outputted to the regulator.

12. The control method of claim 11, wherein a trigger time point of the switch control signal is later than a trigger time point of the trigger signal.

13. The control method of claim 11, wherein activating the generation of the switch control signal according to the trigger signal comprises:
  generating the switch control signal by delaying the trigger signal.

14. The control method of claim 13, wherein delaying the trigger signal comprises:
  utilizing one or more buffers connected in series to delay the trigger signal.

15. The control method of claim 13, wherein delaying the trigger signal comprises:

compare a predetermined voltage with a reference voltage to generate the delayed trigger signal, wherein the reference voltage is generated in response to the base current.

16. The control method of claim 11, wherein activating the generation of the switch control signal according to the trigger signal comprises:
delaying the trigger signal as a delayed trigger signal; and
adjusting a settling time of the delayed trigger signal to generate the switch control signal.

17. A control circuit of a bandgap reference circuit, the bandgap reference circuit being arranged to provide a bandgap voltage to a regulator, the bandgap reference circuit comprising a current generating circuit and a start-up circuit, the start-up circuit being arranged to generate a trigger signal when the bandgap reference circuit starts up, the control circuit comprising:
a trigger time control circuit, coupled to the current generating circuit, wherein a first current mirrored from a base current by the current generating circuit is outputted at a trigger time point of the trigger signal, the trigger time control circuit is arranged to generate a delayed trigger signal at a trigger time point at which the first current mirrored from the base current reduces to a predetermined level; and
a settling time control circuit, coupled to the trigger time control circuit, wherein the settling time control circuit is arranged to adjust a settling time of the delayed trigger signal and accordingly output the delayed trigger signal as a switch control signal; the switch control signal indicates a time at which a second current mirrored from the base current by the current generating circuit is allowed to flow to a terminal coupled to the regulator, and a bandgap voltage is established at the terminal coupled to the regulator according to the second current.

18. The control circuit of claim 17, wherein the trigger time control circuit comprises one or more buffers connected in series; and the one or more buffers connected in series are arranged to delay the trigger signal to generate the delayed trigger signal.

19. The control circuit of claim 17, wherein the trigger time control circuit comprises a comparator; the comparator is arranged to compare a predetermined voltage with a reference voltage to generate the delayed trigger signal; and the reference voltage is generated in response to the base current.

20. The control circuit of claim 17, wherein the settling time control circuit comprises a capacitor; the capacitor is arranged to extend the settling time of the delayed trigger signal to generate the switch control signal.

* * * * *